United States Patent [19]

Okuto

[11] 3,857,169

[45] Dec. 31, 1974

[54] METHOD OF MAKING JUNCTION DIODES

[75] Inventor: Yuji Okuto, Los Angeles, Calif.

[73] Assignee: University of Southern California, Los Angeles, Calif.

[22] Filed: June 21, 1973

[21] Appl. No.: 372,310

[52] U.S. Cl...................... 29/590, 357/52, 357/317
[51] Int. Cl. ........................................ H01l 7/48
[58] Field of Search....... 29/580, 589, 590; 317/235

[56] References Cited

UNITED STATES PATENTS

| | | | |
|---|---|---|---|
| 2,930,722 | 3/1960 | Ligenza | 29/590 |
| 3,519,479 | 7/1970 | Inove et al. | 29/571 X |
| 3,689,993 | 9/1972 | Tolar | 317/235 |

*Primary Examiner*—Roy Lake
*Assistant Examiner*—Craig R. Feinberg
*Attorney, Agent, or Firm*—Harris, Kern, Wallen & Tinsley

[57] ABSTRACT

A method of making a diode with a Shottky junction, including depositing a metal film on the semiconductor and then simultaneously growing an oxide about the metal and forming an alloy junction of the metal and semiconductor.

5 Claims, 4 Drawing Figures

METHOD OF MAKING JUNCTION DIODES

This invention relates to alloy junction diodes and, in particular, to a new and improved method of manufacturing diodes and similar devices having a nearly ideal Shottky junction.

Shottky junctions having nearly ideal I-V characteristics can be obtained utilizing guard rings, but the resultant device has relatively high capacitance due to the guard ring. See for example the paper by M. P. Lepselter and S. M. Sze, Silicon Shottky Barrier Diode with Near Ideal I-V Characteristic, Bell Systems Technical Journal, February 1968, pp. 195–208.

Conventional alloy junctions are produced by first growing a semiconductor oxide on a surface of the semiconductor chip and then making a hole in the oxide layer, as by etching. Next, the metal is deposited on the semiconductor exposed at the hole and then the alloy junction between the metal and semiconductor is formed. In a simpler process, alloy junctions may be made by applying the metal to the semiconductor and then heating in a reducing atmosphere. The resultant devices are not satisfactory because of edge problems and problems encountered in maintaining clean surfaces.

In the method of the present invention, the semiconductor oxide and the alloy junction are formed simultaneously, after the metal has been deposited on the semiconductor. The resultant device has a nearly ideal I-V characteristic without the necessity of a guard ring. Accordingly, it is an object of the invention to provide such a new and improved method of manufacturing a diode. Other objects, advantages, features and results will more fully appear in the course of the following description. The drawing merely shows and the description merely describes a preferred embodiment of the present invention which is given by way of illustration or example.

Figure 1:
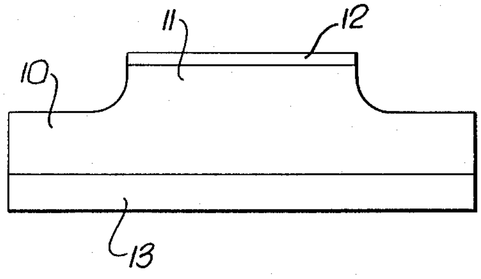
FIG. 1 is a sectional view through a semiconductor wafer illustrating a step in the process of the invention.

In the process of the invention, a semiconductor wafer is prepared in the usual manner and a metal film is applied to a portion of one surface using conventional techniques such as vapor deposition, sputtering or the like. A mesa type construction is preferred but is not necessary, with the mesa being formed by etching away a portion of the semiconductor leaving the upstanding central portion or mesa. FIG. 1 illustrates the semiconductor 10 with the central portion 11 and the metal 12. A standard ohmic contact 13 may be applied to the semiconductor by conventional techniques.

Figure 2:
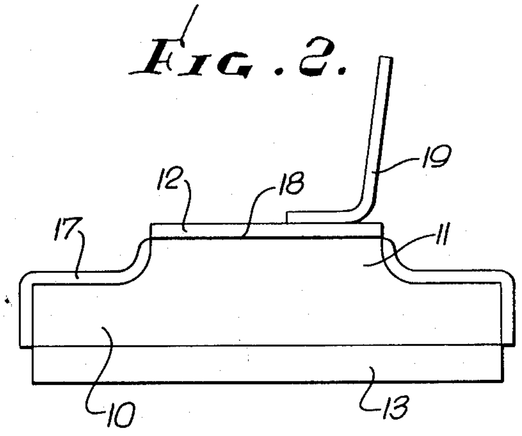
FIG. 2 is a view similar to that of FIG. 1 illustrating a completed diode.

After the metal 12 is applied to the semiconductor 10, an oxide layer is formed on the semiconductor surface about the metal and an alloy junction is formed between the semiconductor and the metal. The oxide and the alloy junction are formed simultaneously. This may be carried out using conventional techniques, such as heating the device in a wet or dry oxygen atmosphere. FIG. 2 illustrates the finished device with oxide layer 17 and junction 18. A terminal lead 19 may be attached to the metal 12. Typically, the device may be maintained at 700°C in steam and oxygen for 15 minutes to produce the oxide and alloy.

One or more of the diodes may be included in an integrated circuit, and the ohmic contact may be on any surface including the surface to which the metal is applied.

The semiconductor 10 typically is silicon and the layer 17 would be silicon dioxide. The metal 12 should be a metal which does not oxidize during the semiconductor oxidation process and one which forms a good silicide barrier with the semiconductor. Preferred materials are platinum and rhodium.

The resultant device has a nearly ideal I-V characteristic for both forward and reverse conditions and does not have a capacitance greater than that of the standard device. The device is suitable for use as a rectifier, a detector, a varactor and an avalanche microwave element. A typical alloy junction may have a one-to-one ratio of metal and semiconductor but this is not necessary and the ratio may be x and y.

Figure 3:
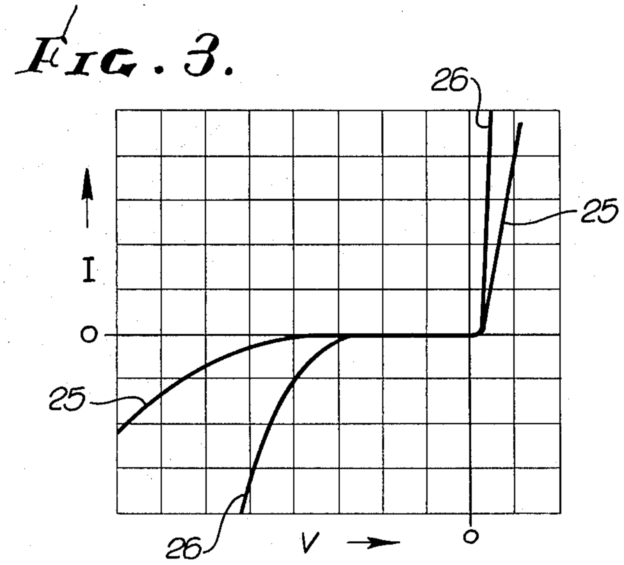
FIGS. 3 and 4 are diagrams illustrating the I-V characteristics of a conventional diode and the diode of the invention, respectively.

FIG. 3 illustrates the I-V characteristics of a conventional alloy junction diode using n-silicon and platinum with $N_D$ about $2\times10^{16}$. In FIG. 3 the scale in the forward and reverse directions is 1 volt per division on the horizontal axis and 50 microamperes per division for curve 25 and 500 microamperes per division for curve 26 on the vertical axis.

Figure 4:
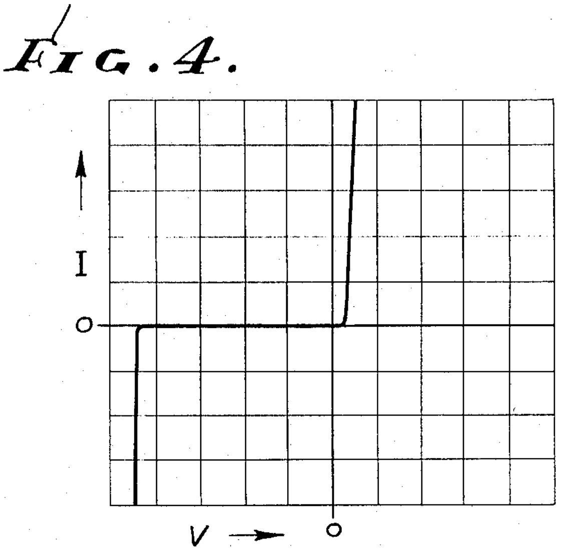

FIG. 4 illustrates the I-V characteristic for a corresponding diode manufactured according to the method of the present invention using the same material as in the diode of FIG. 3. In the forward direction, the scale is 2 volts per division on the horizontal axis and one milliampere per division on the vertical axis. In the reverse direction, the scale is 10 volts per division on the horizontal axis and 1 milliampere per division on the vertical axis.

I claim:

1. A method of making a diode with a Shottky barrier rectifying contact, including the steps of:

depositing a metal on a portion of a surface of a semiconductor; and growing a semiconductor oxide layer on the semiconductor surface about said portion and simultaneously forming an alloy of the metal and semiconductor at said portion producing the rectifying contact at the metal and semiconductor alloy junction.

2. The method of claim 1 including the step of etching the semiconductor to form a mesa defining said portion.

3. The method of claim 1 wherein the metal is platinum and the semiconductor is n type silicon.

4. The method of claim 1 wherein the metal is rhodium and the semiconductor is silicon.

5. The method of claim 1 including the steps of:

applying an ohmic contact to the semiconductor; and applying a terminal lead to the metal.

* * * * *